US012643182B2

(12) United States Patent
Moon et al.

(10) Patent No.: US 12,643,182 B2
(45) Date of Patent: Jun. 2, 2026

(54) LIGHT-ABSORBING EPOXY FILM AND MANUFACTURING METHOD THEREOF

(71) Applicant: Hojeonable Inc., Daejeon (KR)

(72) Inventors: Jong Tae Moon, Gyeryong-si (KR);
Kwang Mo Jung, Gunpo-si (KR)

(73) Assignee: Hojeonable Inc., Daejeon (KR)

( * ) Notice: Subject to any disclaimer, the term of this patent is extended or adjusted under 35 U.S.C. 154(b) by 826 days.

(21) Appl. No.: 17/971,000

(22) Filed: Oct. 21, 2022

(65) Prior Publication Data

US 2023/0131422 A1 Apr. 27, 2023

(30) Foreign Application Priority Data

Oct. 22, 2021 (KR) ........................ 10-2021-0141921

(51) Int. Cl.

| | |
|---|---|
| *C08F 2/46* | (2006.01) |
| *B23K 35/36* | (2006.01) |
| *C08F 2/50* | (2006.01) |
| *C08G 59/24* | (2006.01) |
| *C08G 59/42* | (2006.01) |
| *C08G 59/50* | (2006.01) |
| *C08G 59/68* | (2006.01) |
| *C08G 61/04* | (2006.01) |
| *C08G 77/04* | (2006.01) |
| *C08K 3/04* | (2006.01) |
| *C08K 5/5435* | (2006.01) |
| *C08K 9/06* | (2006.01) |
| *H05K 3/3465* | (2026.01) |

(52) U.S. Cl.

CPC ........ *B23K 35/3613* (2013.01); *C08G 59/245* (2013.01); *C08G 59/42* (2013.01); *C08G 59/50* (2013.01); *C08G 59/686* (2013.01); *C08G 77/04* (2013.01); *C08K 3/04* (2013.01); *C08K 5/5435* (2013.01); *C08K 9/06* (2013.01); *H05K 3/3465* (2026.01); *H05K 2201/10106* (2013.01)

(58) Field of Classification Search
CPC .. H05K 3/3457; H05K 3/3489; H05K 3/3485; H05K 2201/10106; H05K 1/0274; C08G 59/50; C08G 59/42; C08G 59/686; C08G 59/245; C08G 77/04; C08L 63/00; C09J 163/00; C08K 5/5435; C08K 9/06; C09D 163/00; B23K 35/36; B23K 35/13
USPC .................................................. 522/1; 520/1
See application file for complete search history.

(56) References Cited

U.S. PATENT DOCUMENTS

| | | | |
|---|---|---|---|
| 4,431,703 A * | 2/1984 | Somezawa ........... | G11B 5/7253 |
| | | | 428/447 |
| 5,607,609 A * | 3/1997 | Sakuyama ........... | B23K 1/0053 |
| | | | 392/436 |
| 5,853,957 A * | 12/1998 | Yanagawa .............. | H05K 3/287 |
| | | | 430/287.1 |
| 2006/0141381 A1* | 6/2006 | Yoshino ................ | G03F 7/0388 |
| | | | 430/285.1 |
| 2008/0149692 A1* | 6/2008 | Ramanan ............... | B23K 3/082 |
| | | | 228/33 |
| 2013/0137796 A1* | 5/2013 | Kropp .................... | C08G 59/42 |
| | | | 523/428 |

FOREIGN PATENT DOCUMENTS

| | | |
|---|---|---|
| KR | 10-1826950 B1 | 2/2018 |
| KR | 10-2101345 B1 | 4/2020 |
| KR | 10-2202937 B1 | 1/2021 |

\* cited by examiner

*Primary Examiner* — Jessica Whiteley
(74) *Attorney, Agent, or Firm* — Sughrue Mion, PLLC

(57) ABSTRACT

Proposed is an epoxy flux film that is to be positioned between a semiconductor substrate and a device and is heated and pressed without addition of an additional flux. Thus, device-substrate soldering and sealing are simultaneously performed, and interference of light reflected from the solder can be reduced.

14 Claims, No Drawings

LIGHT-ABSORBING EPOXY FILM AND MANUFACTURING METHOD THEREOF

CROSS REFERENCE TO RELATED APPLICATION

The present application claims priority to Korean Patent Application No. 10-2021-014921, filed Oct. 22, 2021, the entire contents of which is incorporated herein for all purposes by this reference.

BACKGROUND OF THE INVENTION

1. Field of the Invention

The present invention relates to a light-absorbing epoxy flux film capable of mitigating interference between light emitted from an optical device and light reflected from the surface of a solder contact by incorporating a surface-modified light-absorbing material.

2. Description of the Related Art

Recent high functionalization of small electronic devices has led to a trend towards high densification of substrates for semiconductor devices and integrated circuits. Thus, soldering processes have become an essential joining technique, which is also required for the bonding of micro LEDs to printed circuit boards or semiconductor substrates.

Recent soldering processes have often adopted a reflow scheme of applying solder paste containing epoxy resin and curing the solder paste by convection of heat. The reaction of an epoxy curing agent is initiated in a heated state, and a low melting point solder melts. In this case, solder gathers inward due to the difference in cohesion between the solder and the epoxy resin to form a metal contact between a substrate and a component, and the epoxy resin contributes to maintaining a chemically stable state by surrounding the metal contact, including the solder.

However, there is a problem that the process steps are complicated. For this reason, recently, a lot of attention has been paid to the development of an all-in-one film with which flux application, soldering, and sealing can be performed by a one-step reaction.

Light-emitting diodes (LEDs) are known for their low power consumption and for rarely causing pollution. Therefore, the demand for light-emitting diodes (LEDs) is explosively increasing. LEDs are mainly in demand as lighting fixtures, backlights for LCD displays, and display devices. The LED is a type of solid device that converts electrical energy into light. The LED is composed of an n-type semiconductor layer, a p-type semiconductor layer, and an active layer disposed between the two layers. When a voltage is applied across the two layers, electrons and holes are introduced into the active layer and then recombined in the active layer to generate light.

As described above, LEDs are characterized by low power consumption, low operating voltage, high energy efficiency, and low pyrogenicity. Due to the above features, LEDs are used as electrical elements for displays.

However, due to the light that is emitted from the LEDs and is reflected from the metal contact, a light interference phenomenon occurs. This interference phenomenon affects the resolution of a display and impression of colors of a display.

To prevent this, a micro array substrate having a patterned thin film layer to prevent reflection of light is disclosed in Korean Patent Application Publication No. 10-0634505 (Jun. 10, 2016). To date, although the technology based on the disclosure is widely used, the process incurs high cost because micro processing is added to the substrate manufacturing process. When a physical impact is applied to the substrate, the micro array is misaligned, resulting in intensification of the reinforcement and interference of the light. Therefore, the overall quality is deteriorated.

Therefore, it is required to use an all-in-one film that improves the production efficiency by simplifying the manufacturing process, is cost effective, and effectively inhibits reflection of light of the LEDs by using a metal contact.

LITERATURE OF RELATED ART

Patent Literature (Patent Literature 1) Korean Patent No. 10-2202937 (Jan. 14, 2021)
(Patent Literature 2) Korean Patent No. 10-2101345 (Apr. 9, 2020)
(Patent Literature 3) Korean Patent No. 10-1826950 (Feb. 1, 2018)

SUMMARY OF THE INVENTION

The objective of the present invention is to provide a light-absorbing epoxy flux film to solve the problems occurring in the related art.

A first aspect of the present invention to accomplish the above objective relates to a composition for a light-absorbing epoxy flux film.

In the first aspect, a composition for a light-absorbing epoxy flux film includes a surface-modified light-absorbing material, an epoxy resin, a phenoxy resin, a surfactant, a catalyst, a curing agent, a reductant, and a non-aqueous silicone anti-foaming agent.

In the first aspect, the surface-modified light-absorbing material may include carbon black.

In the first aspect, the surface-modified light-absorbing material may be a material the surface of which is modified with an epoxy-based silane coupling agent.

In the first aspect, the epoxy-based silane coupling agent may be any one or more selected from the group consisting of 2-(3,4-epoxy cyclohexyl)ethyl trimethoxy silane, 3-glycidoxy propyl methyl dimethoxy silane, 3-glycidoxy propyl trimethoxy silane, 3-glycidoxy propyl methyl diethoxy silane, and 3-glycidoxy propyl triethoxy silane.

In the first aspect, the composition for a light-absorbing epoxy flux film may have a viscosity in a range of 20,000 to 40,000.

In the aspect, the epoxy resin may include a first epoxy resin and a second epoxy resin. The first epoxy resin may include any one or more epoxy resins selected from among bisphenol A epoxy resins and bisphenol F epoxy resins, and the second epoxy resin may include any one or more epoxy resins selected from among silane-modified epoxy resins, urethane-modified epoxy resins, rubber-modified epoxy resins, novolac-type epoxy resins, multi-functional epoxy resins, and hydrogenated epoxy resins.

In the first aspect, the composition for a light-absorbing epoxy flux film may further include a thixotropic agent and a diluent.

In the first aspect, the surfactant may be one material or a combination of two or more materials selected from the group consisting of a nonionic surfactant and a fluorine-based surfactant.

In the first aspect, the catalyst may be any one material or a combination of two or more materials selected from the group consisting of benzyl dimethyl amine, $BF_3$-monoethyl amine, tris(dimethyl aminomethyl)phenol, dimethyl benzanthracene, and methylimidazole.

In the first aspect, the curing agent may be any one or more materials selected from the group consisting of an amine-based material and an anhydride-based material.

In the first aspect, the reducing agent may include a first reducing agent and a second reducing agent.

In the first aspect, the composition for a light-absorbing epoxy flux film may further include solder.

In the aspect, the non-aqueous silicone anti-foaming agent may be dimethylsilicone oil having a kinematic viscosity of 200 to 1500 cSt at 25° C.

A second aspect of the present invention relates to a light-absorbing epoxy flux film formed by curing the composition for a light-absorbing epoxy flux film described above.

In the second aspect, a method of preparing the composition for a light-absorbing epoxy flux film includes:

(first step) modifying a surface of a light-absorbing material with an epoxy-based silane coupling agent;

(second step) mixing an epoxy resin, a phenoxy resin, and a surface-modified light-absorbing material to form a first mixture;

(third step) adding and mixing a catalyst and a first reducing agent to and with the first mixture to form a second mixture;

(fourth step) adding and mixing a second reducing agent to and with the second mixture to form a third mixture;

(fifth step) adding and mixing a curing agent, a catalyst, a surfactant, and a non-aqueous silicone anti-foaming agent to and with the third mixture to produce a light-absorbing epoxy flux film precursor; and (sixth step) curing the light-absorbing epoxy flux film precursor to produce the light-absorbing epoxy flux film.

The light-absorbing epoxy flux film according to the present invention forms a light-absorbing epoxy coating layer on an outer surface of solder contacts formed around a semiconductor substrate, thereby mitigating interference caused by reflected light from the solder contact.

According to the present invention, it is possible to eliminate a barrier wall forming process around a solder contact of a substrate, which was required in a conventional manufacturing process to suppress light reflection from the solder contact. In addition, since the light-absorbing according to the present invention can be manufactured at low cost, the cost-saving effect is significant.

DESCRIPTION OF THE PREFERRED EMBODIMENTS

Hereinafter, a light-absorbing epoxy flux film and a method of manufacturing the same, according to the present invention, will be described in detail. The following descriptions are provided as examples to sufficiently convey the idea of the present invention to those skilled in the art. Accordingly, the present invention is not limited to the descriptions and may be embodied in other forms, and the descriptions presented below may be exaggerated to clarify the spirit of the present invention. In the flowing description, unless otherwise defined, all terms including technical and scientific terms used herein have the same meaning as commonly understood by those who are ordinarily skilled in the art to which this disclosure belongs. Further, when it is determined that the detailed description of the known art related to the present invention might obscure the gist of the present invention, the detailed description thereof will be omitted.

A first aspect of the present invention relates to a composition for a light-absorbing epoxy flux film, the composition including a surface-modified light-absorbing material, an epoxy resin, a phenoxy resin, a surfactant, a catalyst, a curing agent, a reductant, and a non-aqueous silicone anti-foaming agent.

The surface-modified light-absorbing material is not particularly limited if the surface-modified light-absorbing material is a black pigment. Specifically, it is preferable that the surface-modified light-absorbing material includes carbon black particles having particle sizes ranging from 10 nm to 50 nm.

In the first aspect, the surface-modified light-absorbing material may be a material the surface of which is modified with an epoxy-based silane coupling agent. Specifically, the epoxy-based silane coupling agent may be any one or more materials selected from the group consisting of 2-(3,4-epoxy cyclohexyl)ethyl trimethoxy silane, 3-glycidoxy propyl methyl dimethoxy silane, 3-glycidoxy propyl trimethoxy silane, 3-glycidoxy propyl methyl diethoxy silane, and 3-glycidoxy propyl triethoxy silane.

The amount of the silane coupling agent used for the surface modification of the light-absorbing material may be 1% to 20% by weight relative to the light-absorbing material, preferably 3% to 17% by weight, and more preferably 4% to 15% by weight. When the amount of the epoxy-based silane coupling agent used for the surface modification falls within the range described above, the affinity between the epoxy resin and the light-absorbing material increases, thereby improving the dispersibility of the light-absorbing material in the composition and improving the adhesion between the light-absorbing material and a film matrix at a later stage.

The epoxy resin may include a first epoxy resin and a second epoxy resin.

The first epoxy resin may be any one or more epoxy resins selected from among bisphenol A epoxy resins and bisphenol F epoxy resins. In addition, it is preferred that the first epoxy resin has a weight average molecular weight in a range of 1,000 to 100,000, preferably a range of 10,000 to 75,000, and more preferably a range of 15,000 to 60,000.

The second epoxy resin may be any one or more epoxy resins selected from the group consisting of silane-modified epoxy resins, urethane-modified epoxy resins, rubber-modified epoxy resins, novolac-type epoxy resins, multi-functional epoxy resins, and hydrated epoxy resins. In addition, it is preferred that the second epoxy resin has a weight average molecular weight in a range of 1,000 to 200,000, preferably a range of 10,000 to 100,000, and more preferably a range of 15,000 to 75,000.

When the first epoxy resin and the second epoxy resin that satisfy the conditions described above are mixed, the composition can have a proper viscosity during the subsequent film production process. Therefore, it is advantageous in leveling the surface of the film and increasing the adhesion between the film and a printed circuit board.

The phenoxy resin may be any one or more resins selected from the group consisting of bisphenol A phenoxy resin, bisphenol A/bisphenol F phenoxy resin, bisphenol A/bisphenol S phenoxy resin, and caprolactone-modified phenoxy resin. In addition, it is preferred that the second epoxy resin has a weight average molecular weight in a range of 5,000 to 200,000, preferably a range of 12,000 to 100,000, and more preferably a range of 15,000 to 60,000.

The catalyst may include any one or more materials selected from the group consisting of benzyldimethylamine, $BF_3$-monoethylamine, tris(dimethylaminomethyl)phenol, dimethylbenzanthracene, and methylimidazole, but the material of the catalyst is not particularly limited if the material is known to be usable as a catalyst.

The surfactant may include one material or a combination of two or more materials selected from the group consisting of a nonionic surfactant and a fluorine-based surfactant. Examples of the fluorine-based surfactants may be materials using perfluoroalkylamine oxides, perfluoroalkyl polyoxyethylene ethanol, and fluorinated alkyl esters.

The catalyst may be any one material or a combination of two or more materials selected from the group consisting of benzyl dimethyl amine, $BF_3$-monoethyl amine, tris(dimethyl aminomethyl)phenol, dimethyl benzanthracene, and methylimidazole.

The non-aqueous silicone anti-foaming agent is used to reduce the generation of air bubbles. Therefore, low intermolecular attraction, surface water repellency, and prevention of surface contact of the non-aqueous silicone anti-foaming agent lowers surface tension, thereby preventing air bubbles from being stably formed. The anti-foaming performance can be exhibited by this mechanism.

The non-aqueous silicone anti-foaming agent may be included in an amount of 3 to 7 parts by weight relative to 100 parts by weight of the first epoxy resin. When the content of the non-aqueous silicone anti-foaming agent exceeds the range described above, the viscosity of the composition is lowered. Therefore, when the substrate is immersed in the composition, it is difficult to form uniform coating. On the contrary, when the content of the non-aqueous silicone anti-foaming agent is below the range described above, the effect of inhibiting the generation air bubbles is insufficient.

The non-aqueous silicone anti-foaming agent may be dimethylsilicone oil having a kinematic viscosity of 200 to 1500 cSt at 25° C. Miscibility with other materials is insufficient when the composition has a viscosity higher than the range described above, and it is difficult to achieve uniform coating when the composition has a viscosity lower than the range described above due to insufficient viscosity.

The reducing agent may include a first reducing agent and a second reducing agent.

The first reducing agent may include any one or more organic acids selected from the group consisting of glutaric acid, maleic acid, azelaic acid, abietic acid, adipic acid, ascorbic acid, acrylic acid, and citric acid. However, the material of the first reducing agent is not limited thereto if an organic acid is known to be usable as a reducing agent.

The second reducing agent may include any one or more inorganic acids selected from the group consisting of hydrochloric acid, nitric acid, phosphoric acid, boric acid, and dimethylamine hydrochloride. However, the second reducing agent is not limited thereto if an inorganic acid is known to be usable as a reducing agent.

The curing agent hardener may be any one material or a combination of two or more materials selected from the group consisting of amine family materials and anhydride family materials.

Examples of the amine family material may include one or more materials selected from the group consisting of imidazole, meta-phenylenediamine, diaminodiphenyl methane, and diaminodiphenyl sulfone, but the amine family material is not limited if the material is a known material.

The anhydride family material may be any one or more materials selected from the group consisting of phthalic acid anhydride, maleic acid anhydride, dodecenyl succinic anhydride, terephthalic acid anhydride, methyltetrahydrophthalic anhydride, tetrahydrophthalic anhydride, and pyromellitic dianhydride but are not particularly limited thereto if the materials are known materials.

The light-absorbing epoxy flux film composition may further include a thixotropic agent and a diluent.

Preferably, the thixotropic agent is any one material or a combination of two or more materials selected from the group consisting of hydrogenated castor wax, carnauba wax, ethylene glycol, polyglycols, polypropylene glycols, acrylate oligomers, glycerides, simethicone, tributyl phosphate, and silica-based compounds. However, it is not particularly limited if the material is usable as a known thixotropic agent.

Preferably, an organic solvent such as brominated diphenyl ethers is used as the diluent. However, it is not particularly limited if the material is usable as a known diluent.

The light-absorbing epoxy flux film composition may further include solder.

The solder may be any one or more materials selected from the group consisting of Sn—In family materials, Sn—Bi family materials, Sn—Ag family materials, In—Ag family materials, Sn—Bi—Ag family materials, Sn—Bi—Pb family materials, and Sn—Ag—Cu family materials. For example, the low melting point solder may have a compositional ratio such as 58Sn/42Bi, 60Sn/40Bi, 52In/48Sn, 97In/3Ag, 57Bi/42Sn/1Ag, 58Bi/32Pb/16Sn, and 96.5Sn/3Ag/0.5Cu.

The size of the solder particles may be selected according to the size (for example, pitch) of the pattern to which the composition is applied. The larger the size of the pattern, the larger the particle size of the low melting point solder particles. For example, the size of the solder particles may be selected in the range of 5 nm to 100 μm.

The composition of the present invention may further include an auxiliary additive such as a flow modifier or thickener.

The fluid modifier or thickener may be an acrylate polymer compound, denatured cellulose, or the like, and is not particularly limited to a specific material if it is a known material.

The light-absorbing epoxy flux film composition may have a viscosity in a range of 20,000 to 40,000 cps. When the viscosity of the composition falls outside of the range described above, there is a problem that the adhesion efficiency between a substrate and elements may decrease, or it is difficult to uniformly apply the composition on a substrate.

The light-absorbing epoxy flux film composition may include 1 to 10 parts by weight of the surface-modified light-absorbing material with respect to 100 parts by weight of the epoxy-based resin. When the light-absorbing material is included in an amount falling within the range described above, the light-absorbing performance of is maximized. More specific ranges and effects will be described in detail when describing a method of preparing the light-absorbing epoxy flux film composition.

Regarding the components constituting the light-absorbing epoxy flux film composition, the light-absorbing epoxy flux film composition may include the curing agent in an amount of 0.3 to 0.5 equivalent to the epoxy-based resin. In this range, the process efficiency of the light-absorbing epoxy flux film composition according to the present invention can be maximized. More specific composition ranges and effects will be described later when describing a method of preparing the light-absorbing epoxy flux film composition.

In addition, each of the flow modifier and the thickener may be included in an amount of 1 to 15 parts by weight with respect to 100 parts by weight of the first epoxy resin, and the solder may be included in an amount of 10 to 15 parts by weight with respect to 100 parts by weight of the first epoxy resin.

The light-absorbing epoxy flux film composition may further include a leveling agent to facilitate the adjustment of the surface height when forming a film. The leveling agent may be included in an amount of 0.1 to 10 parts by weight relative to 100 parts by weight of the first epoxy resin. When the content of the leveling agent falls within the range described above, the leveling effect is excellent. When the leveling effect is out of the range, the leveling may not proceed well, or the leveling effect may not be obtained at all.

A second aspect of the present invention relates to a light-absorbing epoxy flux film formed by curing the light-absorbing epoxy flux film composition described above.

The light-absorbing epoxy flux film may have a thickness in a range of 10 to 500 μm, preferably a range of 10 to 350 μm, and more preferably a range of 10 to 200 μm. When the thickness is smaller than the lower limit of the range described above, the gap between a substrate and an electrode may not be sufficient, resulting in short-circuiting, or a printed circuit board may be easily damaged by an external impact. When the thickness is larger than the upper limit of the range described above, it is undesirable because the defect rate is increased when forming contacts.

The method for preparing the light-absorbing epoxy flux film composition includes the following steps:

(first step) modifying a surface of a light-absorbing material with an epoxy-based silane coupling agent;

(second step) mixing an epoxy resin, a phenoxy resin, and a surface-modified light-absorbing material to form a first mixture;

(third step) adding and mixing a catalyst and a first reducing agent to and with the first mixture to form a second mixture;

(fourth step) adding and mixing a second reducing agent to and with the second mixture to form a third mixture;

(fifth step) adding and mixing a curing agent, a catalyst, a surfactant, and a non-aqueous silicone anti-foaming agent to and with the third mixture to produce a light-absorbing epoxy flux film precursor; and (sixth step) curing the light-absorbing epoxy flux film precursor to produce the light-absorbing epoxy flux film.

In the first step, the light-absorbing material may be a material that is surface-modified with one or more epoxy-based silane coupling agents selected from the group consisting of 2-(3,4 epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane.

The amount of the silane coupling agent used for the surface modification of the light-absorbing material may be in a range of 1% to 20% by weight relative to the light-absorbing material, preferably a range of 3% to 17% by weight, and more preferably a range of 4% to 15% by weight. When such a range is satisfied, epoxy functional groups of the silane coupling agent on the surface of the light-absorbing material may directly participate in the reaction during the surface modification. Therefore, such a range is desirable in terms of improving the dispersibility and adhesion of the light-absorbing material.

In the second step, the epoxy resin constituting the first mixture may include a first epoxy resin and a second epoxy resin. The weight ratio of the first epoxy resin:the second epoxy resin may be in a range of 1:0.01 to 1:0.20. Preferably, the weight ratio of the first epoxy resin:the second epoxy resin may be in a range of 1:0.02 to 1:0.15 and more preferably a range of 1:0.05 to 1:0.10. When the epoxy resins are mixed in such a weight ratio range, a film can become flowable due to the energy that is applied during the subsequent film forming process.

In the second step, the content of the surface-modified light-absorbing material included in the first mixture may be in a range of 1 to 10 parts by weight the with respect to 100 parts by weight of the epoxy-based resin. In this case, it is preferable that the surface-modified light-absorbing material is included in an amount of 1 to 7.5 parts by weight with respect to 100 parts by weight of the epoxy-based resin. More preferably, the surface-modified light-absorbing material is included in an amount of 1 to 5 parts by weight with respect to 100 parts by weight of the epoxy-based resin.

When the content of the surface-modified light-absorbing material exceeds the range, the adhesive strength between a device and a substrate may deteriorate, resulting in insufficient durability. When the content of the surface-modified light-absorbing material is below the range, it is not desirable because a sufficient light-absorbing effect cannot be achieved.

In the third step, the second mixture preferably contains 10 to 15 parts by weight of the catalyst with respect to 100 parts by weight of the curing agent. When the catalyst is included in the content range, when a new sealing layer is formed during bonding a lead of an electronic component to solder of a board through heating, there is a low probability of bubbles forming. Therefore, the effect of the present invention can be maximized.

In the third step, the first reducing agent may include any one organic acid or two or more organic acids selected from the group consisting of glutaric acid, maleic acid, azelaic acid, abietic acid, adipic acid, ascorbic acid, acrylic acid, and citric acid. However, any material can be unlimitedly used if the material is an organic acid that can be used a reducing agent.

The second reducing agent may include any one or more inorganic acids selected from the group consisting of hydrochloric acid, nitric acid, phosphoric acid, boric acid. However, any material can be unlimitedly used if the material is an inorganic acid that can be used a reducing agent.

The first reducing agent may be included in an amount of 50 to 150 parts by weight with respect to 100 parts by weight of the first epoxy resin, and the second reducing agent may be included in an amount of 40 to 140 parts by weight with respect to 100 parts by weight of the first epoxy resin. In this case, it is preferable that the first reducing agent may be included in an amount of 80 to 120 parts by weight with respect to 100 parts by weight of the first epoxy resin, and the second reducing agent may be included in an amount of 60 to 120 parts by weight with respect to 100 parts by weight of the first epoxy resin. When the content of each of the first and second reducing agents falls within the range described above, it is preferable because there is no excessive reaction between the electrode of a device and the pad of a printed circuit board due to the reducing agents.

In the fourth step, the second mixture preferably contains 15 to 50 parts by weight of solder with respect to 100 parts by weight of the second mixture. When the content of the solder exceeds the content range described above, a metal contact between a device and a semiconductor may be excessively large, resulting in current leakage or short circuiting. When the content of the solver is below the range described above, it is not desirable because a sufficient metal contact cannot be obtained and thus current conduction may not be failed.

In the fourth step, the light-absorbing epoxy flux film composition of the present invention may further include a leveling agent that facilitates the adjustment of the surface height during film formation.

In the fifth step, it is preferable that the amount of the curing agent constituting the first mixture is in a range of 0.2 to 0.6 equivalents relative to the amount of the epoxy resin. When the content of the curing agent exceeds the range described above, the resistance of the epoxy to high temperature and high humidity and chemical resistance of the epoxy may be deteriorated. When the content of the curing agent is below the range described below, it is not desirable because the epoxy resin cannot be easily cured.

In the fifth step, the light-absorbing epoxy flux film composition may include a surfactant in an amount of 20 to 25 parts by weight with respect to 100 parts by weight of the first epoxy resin. The surfactant may be a fluorine-based surfactant or a nonionic surfactant. Specifically, the fluorine-based surfactant may be any one or may include two or more materials selected from the group consisting of perfluoroalkylamine oxide, perfluoroalkyl polyoxyethylene ethanol, and fluorinated alkyl esters. It is desirable to use the fluorine-based surfactant in terms of improving the chemical resistance, moisture resistance, and high temperature durability of the epoxy layer.

The surfactant may improve the adhesive strength of the light-absorbing epoxy flux film composition and reduce the interface tension to promote uniform mixing of the mixtures. When the content of the surfactant exceeds the range described above, the flowability of the light-absorbing epoxy flux film composition is increased, and thus it is difficult for the composition to uniformly surround an electrode of a device and a pad of a semiconductor substrate. When the content of the surfactant is below the range described above, since the light-absorbing epoxy flux film composition cannot be uniformly mixed, the adhesion performance of the film subsequently formed may be decreased.

In the fifth step, a diluent or a thixotropic agent may be added to the curing agent.

In the fifth step, the diluent may be any one or include two or more solvents selected from the group consisting of dimethyl sulfoxide (DMSO), N,N-dimethylformamide (DMF), brominated diphenylether (BDE), and the like. However, the diluent is not particularly limited if it is a substance usable as a known diluent. The diluent may be included in an amount of 50 to 60 parts by weight relative to 100 parts by weight of the first epoxy resin.

Preferably, in the fifth step, the thixotropic agent is any one material or a combination of two or more materials selected from an organic material group consisting of hydrogenated castor wax, carnauba wax, ethyleneglycol, propyleneglycol, polyglycols, polypropylene glycol, acrylate oligomers, glycerides, simethicone, tributyl phosphate, etc. or selected from the group consisting of silica compounds. The thixotropic agent may be included in an amount of 5 to 15 parts by weight with respect to 100 parts by weight of the curing agent.

In the fifth step, when the diluent and the thixotropic agent are added in the content ranges described above, respectively, the viscosity adjustment and thixotropic control can be easily achieved.

The film may be formed by processing the light-absorbing film composition using one or more methods selected from among a comma coating process, a slot die coating process, a gravure coating process, and a microgravure coating process.

Hereinafter, a light-absorbing epoxy flux film and a method of manufacturing the same, according to the present invention, will be described in detail. However, the examples described above are presented only for illustrative purposes and are intended to limit the present invention. The present invention can be embodied in other forms in addition to the forms presented by the examples.

In addition, unless otherwise defined, all technical and scientific terms have the same meaning as that is generally understood by the ordinarily skilled in the art to which the present invention pertains. The terms used in the description of the specification of the present application are only intended to effectively describe specific examples and are not intended to limit the present invention. Unless otherwise stated herein, the units of the amounts of additives may be % by weight (wt %)

Preparation Example 1

9 g of carbon black having an average particle size of 40 nm was prepared. Ethanol and carbon black particles were mixed in a 1:1 weight ratio to modify the surface of the carbon black particles, and the mixture was stirred for 1 hour. Next, 1 g of X-12-984S (3-glycidoxypropyltrimethoxysilane) manufactured by Shinetsu was added and stirred for 2 hours in a thermostat set to 40° C. Next, ethanol was then removed by a rotary evaporator, so that a surface-modified light-absorbing material was finally obtained.

Example 1

100 g of YD-127, which is bisphenol A epoxy resin manufactured by Kukdo Chemical Co., Ltd., was used as a first epoxy resin. YDCN-500-4P, which is o-cresol-type movolac epoxy resin manufactured by Kukdo Chemical Co., Ltd., was used as a second epoxy resin. YP-50 manufactured by Kukdo Chemical Co., Ltd. was used as phenoxy resin. The resins were mixed in ratios shown in Table 1, and 17 g of the material of Preparation Example 1 was added to prepare a first mixture.

Next, 10 g of $BF_3$-monoethylamine as a catalyst and 100 g of maleic acid as a first reducing agent were added to the first mixture and mixed for 30 minutes at a speed of 30 rpm to obtain a second mixture.

Next, 100 g of boric acid was added to the second mixture as a second reducing agent and mixed for 30 minutes at a speed of 30 rpm to obtain a third mixture.

The curing agent (2MA-OK, manufactured by Shikoku Chemical Co., Ltd.) and a silicone anti-foaming agent were placed in a container and mixed at 120° C. for 20 minutes until the curing agent was completely dissolved.

20 g of a curing agent, a silicone anti-foaming agent, 20 g of a thixotropic agent (polydimethylsiloxane), 10 g of a solder powder, and 1 g of a leveling agent (BYK-350, manufactured by BYK) were added to the third mixture. 20 g of a surfactant (FC-4430) was added dropwise to the mixture at a rate of 30 g/min and mixing for 30 minutes. Thus, a light-absorbing epoxy flux film composition was obtained. Although not specified in Table 1, the curing agent was added in an amount of 0.4 equivalent. The curing was completed and thus an epoxy flux film was manufactured.

Examples 2 to 5

Epoxy flux films were prepared in the same manner as in Example 1, except that the composition of the first mixture was adjusted as specified in Table 1 below.

Comparative Examples 1 to 4

Epoxy flux films were prepared in the same manner as in Example 1, except that the composition of the first mixture was adjusted as specified in Table 1 below.

TABLE 1

| (Parts by weight) | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|
| Epoxy 1 | 100 | 100 | 100 | 100 | 100 | 100 | 100 | 100 | 100 |
| Epoxy 2 | 12 | 2 | 20 | 12 | 12 | 1 | 30 | 12 | 12 |
| Phenoxy | 30 | 30 | 30 | 20 | 50 | 30 | 30 | 10 | 60 |

Comparative Examples 5 to 8

Epoxy flux films were prepared in the same manner as in Example 1, except that the composition of the third mixture was adjusted as specified in Table 2 below.

TABLE 2

| (g) | Example 1 | Comparative Example 5 | Comparative Example 6 | Comparative Example 7 | Comparative Example 8 |
|---|---|---|---|---|---|
| First reducing agent | 100 | 40 | 160 | 100 | 100 |
| Second reducing agent | 100 | 100 | 100 | 20 | 150 |

Comparative Examples 9 to 13

Epoxy flux films were manufactured in the same manner as in Example 1, except that the composition ratio of the materials was adjusted as in Table 3 below when manufacturing the material of Preparation Example 1.

TABLE 3

| (g) | Example 1 | Comparative Example 9 | Comparative Example 10 | Comparative Example 11 | Comparative Example 12 | Comparative Example 13 |
|---|---|---|---|---|---|---|
| Light-absorbing material | 9 | 9 | 9 | 25 | 0.9 | 9 |
| Silane coupling agent | 1 | 0.05 | 3 | 3 | 0.09 | — |

[Method of Characterization]

Micro RGB devices were placed at the bottom of a glass interposer and then aligned on the films of Examples 1 to 5 and Comparative Examples 1 to 13 positioned on a printed circuit board. Subsequently, heat and pressure were applied so that the printed circuit board and the micro RGB devices were bonded to each other.

A. Evaluation of Adhesion Performance of Epoxy Flux Film

The bonding strength between the printed circuit boards and the micro LED devices and the bonding strength of the epoxy film layers of Examples 1 to 5 and Comparative Examples 1 to 4 were measured.

TABLE 4

| | Metal contact Bonding strength (kgf) | Epoxy layer Bonding strength (kgf) |
|---|---|---|
| Example 1 | 30.1 | 1.53 |
| Example 2 | 31.1 | 1.40 |
| Example 3 | 29.7 | 1.41 |
| Example 4 | 29.9 | 1.48 |
| Example 5 | 30.5 | 1.45 |
| Comparative Example 1 | 29.7 | 0.91 |
| Comparative Example 2 | 29.9 | 0.97 |
| Comparative Example 3 | 31.0 | 1.02 |
| Comparative Example 4 | 30.5 | 1.11 |

As shown in Table 4, in the cases of Comparative Examples 1 to 4 in which the composition ratio of the ingredients of the first mixture falls outside the range proposed by the present invention, it is seen that the bonding strength of the epoxy layer is relatively low (1.11 kgf or less). On the other hand, in the cases of Examples 1 to 5 in which the composition ratio of the ingredients falls within the range proposed by the present invention, the bonding strength of the epoxy layer was relatively high (1.40 to 1.53 kgf).

B. Evaluation of Flux Effect

After substrate-device bonding of Example 1 and Comparative Examples 5 to 8, the substrates were left in a high temperature, high humidity environment for one week, and then the degree of corrosion of the devices and contacts was observed. In addition, the degree of uniformity between each epoxy flux film and the contact of each substrate was observed and shown in Table 5.

TABLE 5

| | Example 1 | Comparative Example 5 | Comparative Example 6 | Comparative Example 7 | Comparative Example 8 |
|---|---|---|---|---|---|
| Degree of corrosion | ○ | ○ | X | ○ | X |
| Uniformity | ○ | Δ | ○ | X | ○ |

The evaluation indicators for each item are as follows:
○: No corrosion/uniform contact surface between epoxy and substrate
Δ: Weak corrosion/there is a gap between epoxy and substrate.
X: very severe corrosion/there is a large gap between epoxy and substrate.

As specified in Table 5, corrosion of the substrate occurred in Comparative Examples 6 and 8, where the content of the reducing agent was excessively high. Comparative Examples 5 and 7, where the content of the reducing agent was less than the amount of the reducing agent, were poorly wet with respect to the substrate of the epoxy flux film. Therefore, there was a gap in the adhesive surface.

C. Evaluation of Sealing of Contact

In connection with Example 1 and Comparative Examples 9 to 12, when forming a contact, integrity of a solder contact and epoxy sealing surrounding the solder contact were observed.

TABLE 6

| | Example 1 | Comparative Example 9 | Comparative Example 10 | Comparative Example 11 | Comparative Example 12 |
|---|---|---|---|---|---|
| Contact formation | ○ | ○ | Δ | ○ | ○ |
| Shilling performance | ○ | Δ | ○ | Δ | ○ |

The evaluation indicators for each item are as follows:
○: No defects in solder contact/good sealing
Δ: Defects in solder contact/presence of bubbles or flaws
X: Poor solder contact formation/contact is exposed to the outside.

As shown in Table 6, when the silane coupling agent is excessively included and when the absorbent material is excessively included, there is a problem that defects occur when forming contacts. When the silane coupling agent is added in a trace amount, there is a problem of flaws due to poor wetness between the contact and the epoxy.

D. Measurement of Light-Absorbing Performance

The light-absorbing performance of the epoxy films of Example 1 and Comparative Examples 9 to 13 for visible light was measured, and the results are summarized in Table 6.

TABLE 7

| | Red light (660 nm) reflectivity (%) | Green light (550 nm) reflectivity (%) | Blue light (470 nm) Reflectivity (%) |
|---|---|---|---|
| Example 1 | 6. 8 | 5.5 | 5.4 |
| Comparative Example 9 | 18.1 | 19.3 | 17.7 |
| Comparative Example 10 | 9.2 | 8.8 | 6.4 |
| Comparative Example 11 | 6.1 | 5.4 | 5.3 |
| Comparative Example 12 | 68.7 | 66.8 | 67.4 |
| Comparative Example 13 | 24.3 | 18.6 | 17.7 |

As shown in Table 7, in the case of Example 1, the reflectivity for visible light was measured to be less than 10%. In the case of Comparative Example 9 in which a less amount of the silane coupling agent was than Example 1, reflectivity for visible light was high due to a poor affinity between the light-absorbing material and the epoxy. In the case of Comparative Example 10 in which the silane coupling agent was excessively used, the reflectivity was increased. In addition, in the case of Comparative Example 11 in which the amount of the light-absorbing material was excessively included, the efficiency was poor, and the difference in efficiency between Example 1 and Comparative Example 11 was little. IN the case of Comparative Example 12, the content of the light-absorbing material was low, and thus the light-absorbing performance was not exhibited. In the case of Comparative Example 13, since the silane coupling agent was not used, wettability was deteriorated, and thus a void is created between the light-absorbing material and the epoxy resin, resulting in increase in reflectivity of visible light.

The present invention has been described with reference to some specific examples and characters. However, the specific examples and characteristics are only for illustrative purposes and are intended to limit the scope of the present invention, and it will be appreciated that various modifications and changes are possible from the above description by those skilled in the art to which the present invention pertains.

Therefore, the spirit of the present invention is not limited to the specific examples described above, and all forms defined by the appended claims and all equivalents and modifications thereto fall within the scope of the present invention.

What is claimed is:

1. A light-absorbing epoxy flux film composition comprising a surface-modified light-absorbing material, an epoxy resin comprising a first epoxy resin and a second epoxy resin, a phenoxy resin, a surfactant, a catalyst, a curing agent, a reductant comprising a first reducing agent and a second reducing agent, and a non-aqueous silicone anti-foaming agent,
   wherein the first reducing agent is in an amount of 50 to 150 parts by weight with respect to 100 parts by weight of the first epoxy resin, and
   wherein the second reducing agent is in an amount of 40 to 140 parts by weight with respect to 100 parts by weight of the first epoxy resin.

2. The composition of claim 1, wherein the surface-modified absorbent material comprises carbon black.

3. The composition of claim 2, wherein the surface-modified absorbent material is surface-modified with an epoxy-based silane coupling agent.

4. The composition of claim 3, wherein the epoxy-based silane coupling agent comprises one or more selected from the group consisting of 2-(3,4-epoxy cyclohexyl)ethyl trimethoxy silane, 3-glycidoxy propyl methyl dimethoxy silane, 3-glycidoxy propyl trimethoxy silane, 3-glycidoxy propyl methyl diethoxy silane, and 3-glycidoxy propyl triethoxy silane.

5. The composition of claim 1, wherein the composition has a viscosity in a range of 20,000 to 40,000 cps.

6. The composition of claim 1, wherein the first epoxy resin comprises one or more epoxy resins selected from among bisphenol A epoxy resins or bisphenol F epoxy resins, and the second epoxy resin comprises one or more epoxy resins selected from among silane-modified epoxy resins, urethane-modified epoxy resins, rubber-modified epoxy resins, novolac-type epoxy resins, multi-functional epoxy resins, and hydrogenated epoxy resins.

7. The composition of claim 1, further comprising a thixotropic agent and a diluent.

8. The composition of claim 1, wherein the surfactant comprises one or more selected from the group consisting of a nonionic surfactant and a fluorine-based surfactant.

9. The composition of claim 1, wherein the catalyst comprises one material or comprises two or more materials selected from the group consisting of benzyl dimethyl amine, $BF_3$-monoethyl amine, tris(dimethyl aminomethyl) phenol, dimethyl benzanthracene, and methylimidazole.

10. The composition of claim 1, wherein the curing agent is one or more materials selected from the group consisting of amine family materials and anhydride family materials.

11. The composition of claim 1, further comprising solder.

12. The composition of claim 1, wherein the non-aqueous silicone anti-foaming agent is dimethylsilicone oil having a kinematic viscosity of 200 to 1500 cSt at 25° C.

13. A light-absorbing epoxy flux film formed by curing the light-absorbing epoxy flux film composition of claim 1.

14. A method of manufacturing a light-absorbing epoxy flux film, the method comprising:

(first step) modifying a surface of a light-absorbing material with an epoxy-based silane coupling agent;

(second step) mixing an epoxy resin, a phenoxy resin, and a surface-modified light-absorbing material to form a first mixture;

(third step) adding and mixing a catalyst and a first reducing agent to and with the first mixture to form a second mixture;

(fourth step) adding and mixing a second reducing agent to and with the second mixture to form a third mixture;

(fifth step) adding and mixing a curing agent, a catalyst, a surfactant, and a non-aqueous silicone anti-foaming agent to and with the third mixture to produce a light-absorbing epoxy flux film precursor; and (sixth step) curing the light-absorbing epoxy flux film precursor to produce the light-absorbing epoxy flux film;

wherein the first reducing agent is in an amount of 50 to 150 parts by weight with respect to 100 parts by weight of the first epoxy resin, and wherein the second reducing agent is in an amount of 40 to 140 parts by weight with respect to 100 parts by weight of the first epoxy resin.

* * * * *